(12) United States Patent
Wieting

(10) Patent No.: US 7,863,074 B2
(45) Date of Patent: Jan. 4, 2011

(54) PATTERNING ELECTRODE MATERIALS FREE FROM BERM STRUCTURES FOR THIN FILM PHOTOVOLTAIC CELLS

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/565,735

(22) Filed: Sep. 23, 2009

(65) Prior Publication Data

US 2010/0261307 A1 Oct. 14, 2010

Related U.S. Application Data

(60) Provisional application No. 61/101,650, filed on Sep. 30, 2008.

(51) Int. Cl.
*H01L 21/20* (2006.01)
(52) U.S. Cl. .............................. 438/57; 438/59; 438/62; 438/95; 438/99; 257/E31.007; 257/E31.027
(58) Field of Classification Search ............ 438/57–62, 438/95–99; 257/E31.007, 27
See application file for complete search history.

(56) References Cited

U.S. PATENT DOCUMENTS

| | | | |
|---|---|---|---|
| 4,996,108 A | | 2/1991 | Divigalpitiya et al. |
| 5,125,984 A | | 6/1992 | Kruehler et al. |
| 5,261,968 A | | 11/1993 | Jordan |
| 5,501,744 A | | 3/1996 | Albright et al. |
| 5,536,333 A | | 7/1996 | Foote et al. |
| 5,622,634 A | * | 4/1997 | Noma et al. .................... 216/40 |
| 5,665,175 A | | 9/1997 | Safir |
| 5,985,691 A | * | 11/1999 | Basol et al. .................... 438/95 |
| 6,328,871 B1 | | 12/2001 | Ding et al. |
| 6,361,718 B1 | * | 3/2002 | Shinmo et al. ............. 264/1.21 |
| 6,423,565 B1 | * | 7/2002 | Barth et al. .................... 438/57 |
| 6,632,113 B1 | * | 10/2003 | Noma et al. .................... 445/2 |
| 7,220,321 B2 | * | 5/2007 | Barth et al. ................. 118/729 |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner*—Michael S Lebentritt
(74) *Attorney, Agent, or Firm*—Townsend and Townsend and Crew LLP

(57) ABSTRACT

A method for forming a thin film photovoltaic device having patterned electrode films includes providing a soda lime glass substrate with an overlying lower electrode layer comprising a molybdenum material. The method further includes subjecting the lower electrode layer with one or more pulses of electromagnetic radiation from a laser source to ablate one or more patterns associated with one or more berm structures from the lower electrode layer. Furthermore, the method includes processing the lower electrode layer comprising the one or more patterns using a mechanical brush device to remove the one or more berm structures followed by treating the lower electrode layer comprising the one or more patterns free from the one or more berm structures. The method further includes forming a layer of photovoltaic material overlying the lower electrode layer and forming a first zinc oxide layer overlying the layer of photovoltaic material.

20 Claims, 7 Drawing Sheets

U.S. PATENT DOCUMENTS

| | | |
|---|---|---|
| 7,252,923 B2 * | 8/2007 | Kobayashi ............... 430/270.1 |
| 7,364,808 B2 | 4/2008 | Sato et al. |
| 7,736,755 B2 * | 6/2010 | Igarashi et al. .............. 428/690 |
| 7,741,560 B2 * | 6/2010 | Yonezawa ................... 136/264 |
| 2002/0004302 A1 | 1/2002 | Fukumoto et al. |
| 2002/0061361 A1 | 5/2002 | Nakahara et al. |
| 2006/0220059 A1 | 10/2006 | Satoh et al. |
| 2007/0089782 A1 | 4/2007 | Scheuten et al. |
| 2007/0151596 A1 | 7/2007 | Nasuno et al. |
| 2007/0169810 A1 | 7/2007 | Van Duren et al. |
| 2008/0041446 A1 | 2/2008 | Wu et al. |
| 2008/0092945 A1 | 4/2008 | Munteanu et al. |
| 2008/0092953 A1 | 4/2008 | Lee |
| 2008/0110491 A1 | 5/2008 | Buller et al. |
| 2008/0210303 A1 | 9/2008 | Lu et al. |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

International Search Report & Written Opinion of PCT Application No. PCT/US/09/59095, date of mailing Dec. 4, 2009, 12 pages total.

* cited by examiner

PATTERNING ELECTRODE MATERIALS FREE FROM BERM STRUCTURES FOR THIN FILM PHOTOVOLTAIC CELLS

CROSS-REFERENCES TO RELATED APPLICATIONS

This application claims priority to U.S. Provisional Patent Application No. 61/101,650, filed Sep. 30, 2008, entitled "PATTERNING ELECTRODE MATERIALS FREE FROM BERM STRUCTURES FOR THIN FILM PHOTOVOLTAIC CELLS" by inventor Robert D. Wieting, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure for fabricating thin film solar cells. Merely by way of example, the present method includes patterning electrode material free from berm structures for manufacture of thin film photovoltaic cells, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, thin films are often difficult to manufacture in a cost effective, efficient, and reliable way. These and other limitations of these conventional technologies can be found throughout the present specification and more particularly below.

BRIEF SUMMARY OF THE INVENTION

The present invention relates generally to photovoltaic materials and manufacturing method. More particularly, the present invention provides a method and structure for fabricating thin film solar cells. Merely by way of example, the present method includes patterning electrode material free from berm structures for manufacture of thin film photovoltaic cells, but it would be recognized that the invention may have other configurations.

In a specific embodiment, the present invention provides a method for forming a thin film photovoltaic device having patterned electrode films. The method includes providing a soda lime glass substrate comprising a surface region and forming a lower electrode layer comprising a molybdenum material overlying the surface region. The method further includes subjecting the lower electrode layer with one or more pulses of electromagnetic radiation from a laser source. The one or more pulses of electromagnetic radiation is capable of ablating one or more patterns from the lower electrode layer. The one or more patterns includes one or more berm structures. Additionally, the method includes processing the lower electrode layer comprising the one or more patterns using a mechanical brush device to remove the one or more berm structures. The method further includes treating the lower electrode layer comprising the one or more patterns free from the one or more berm structures. Furthermore, the method includes forming a layer of photovoltaic material overlying the lower electrode layer. The layer of photovoltaic material comprising an interconnect structure based on the one or more patterns within the lower electrode layer. Moreover, the method includes forming a first zinc oxide layer overlying the layer of photovoltaic material.

In another specific embodiment, the present invention provides a method for forming a thin film photovoltaic device having patterned electrode films. The method includes providing a soda lime glass substrate comprising a surface region and forming a lower electrode layer comprising a molybdenum material overlying the surface region. The method also includes subjecting the lower electrode layer with one or more pulses of electromagnetic radiation from a laser source for ablating one or more patterns from the lower electrode layer. The one or more patterns includes one or more berm structures. Additionally, the method includes processing the lower electrode layer comprising the one or more patterns using a mechanical brush device and a cleaning liquid to remove the one or more berm structures. Furthermore, the method includes processing the lower electrode layer comprising the one or more patterns free from the one or more berm structures using a gas knife. The gas knife is configured to remove substantially any liquid including liquid droplets from a surface of the lower electrode layer to dry the lower electrode layer comprising the one or more patterns free from the one or more berm structures.

Many benefits are achieved by ways of present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. In a specific embodiment, the present invention provides a resulting structure that is reliable and free from berm structures and the like. In preferred embodiments, the present invention uses commonly used tools and process technology. Depending on the embodiment, one or more of the benefits can be achieved. These and other benefits will be described in more detailed throughout the present specification and particularly below.

Merely by way of example, the present method and materials include absorber materials made of copper indium disulfide species, copper tin sulfide, iron disulfide, or others for single junction cells or multi junction cells.

DETAILED DESCRIPTION OF THE INVENTION

The present invention relates generally to photovoltaic materials and manufacturing method. More particularly, the present invention provides a method and structure for fabricating thin film solar cells. Merely by way of example, the present method includes patterning electrode material formed on a soda lime glass substrate using electromagnetic radiations and processing the electrode material free from berm structures for manufacture of thin film photovoltaic cells, but it would be recognized that the invention may have other configurations.

Figure 1:
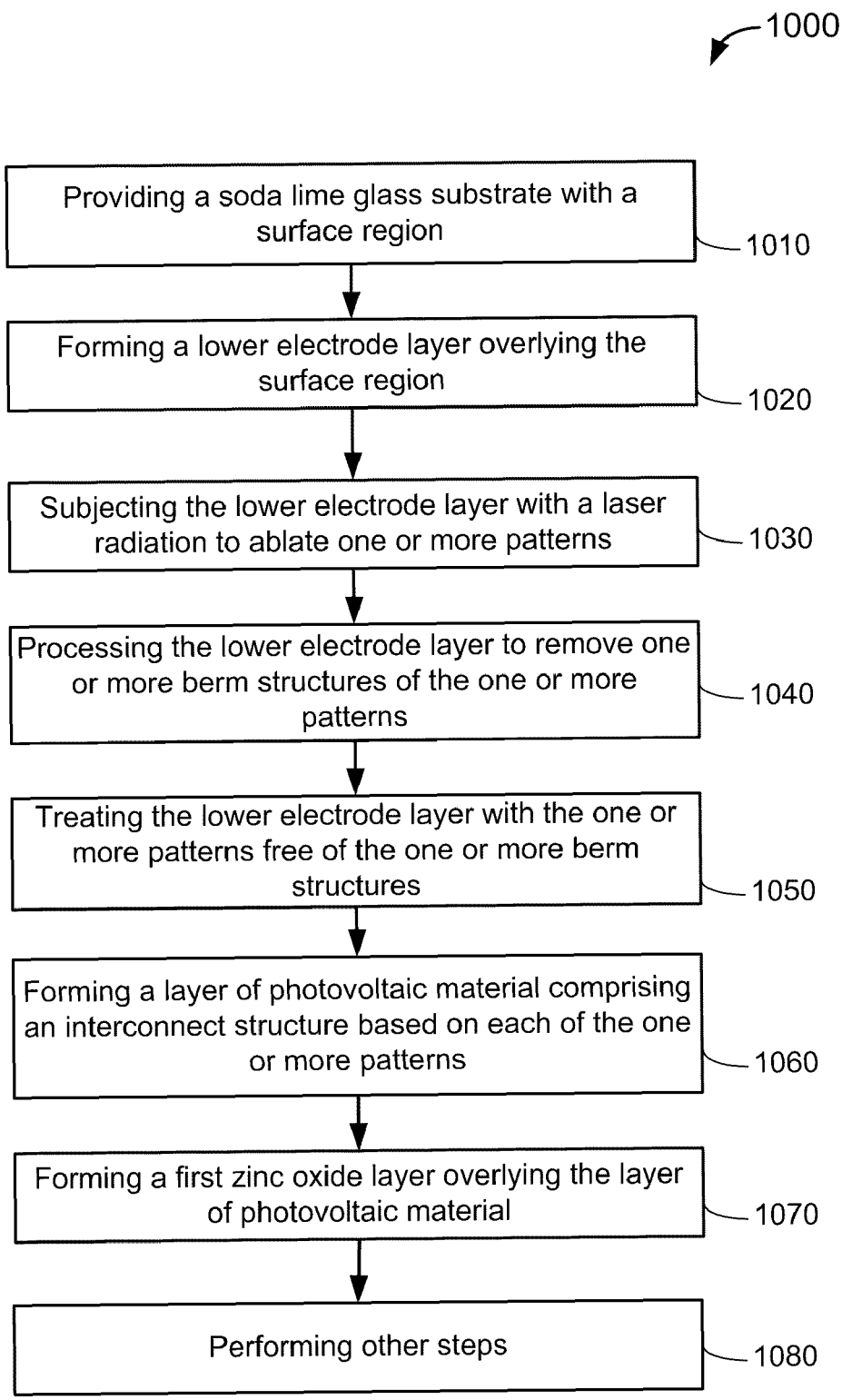
FIG. 1 is a simplified flowchart illustrating a method of fabricating a thin film photovoltaic cell according to an embodiment of the present invention.

FIG. 1 is a simplified flowchart illustrating a method of fabricating a thin film photovoltaic cell according to an embodiment of the present invention. This diagram is merely an example, which should not unduly limit the scope of the claims herein. The method 1000 includes the following processes:

1. Process 1010 for providing a soda lime glass substrate with a surface region;
2. Process 1020 for forming a lower electrode layer overlying the surface region;
3. Process 1030 for subjecting the lower electrode layer with a laser radiation to ablate one or more patterns;
4. Process 1040 for processing the lower electrode layer to remove one or more berm structures of the one or more patterns;
5. Process 1050 for treating the lower electrode layer with the one or more patterns free of the one or more berm structures;
6. Process 1060 for forming a layer of photovoltaic material comprising an interconnect structure based on each of the one or more patterns;
7. Process 1070 for forming a first zinc oxide layer overlying the layer of photovoltaic material;
8. Process 1080 for performing other steps.

The above sequence of processes provides a method of patterning an electrode layer and processing the electrode layer to form one or more patterns free of berm structures for manufacture of thin film photovoltaic cells according to an embodiment of the present invention. In a specific embodiment, the method includes applying laser radiations for ablating the one or more patterns from a continuous electrode layer. In another specific embodiment, the method also includes using mechanical brush device for processing the one or more patterns. Other alternatives can also be provided where processes are added, one or more processes are removed, or one or more processes are provided in a different sequence without departing from the scope of the claims herein. For example, a barrier layer can be formed before the lower electrode layer is formed. More functional layers with different material compositions can be inserted between the layer of photovoltaic material and the first zinc oxide layer, and so on. Further details of the method can be found throughout the present specification and more particularly below.

Figure 2:
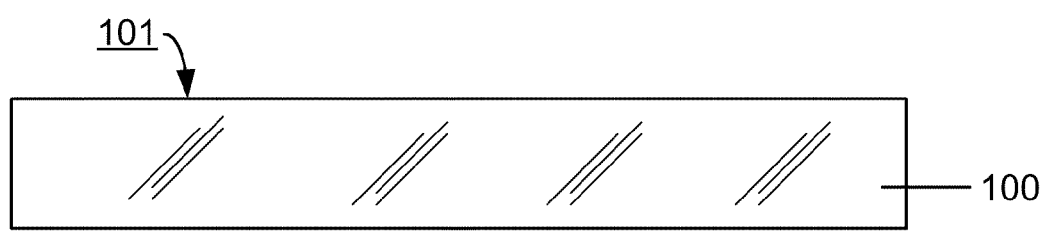
FIGS. 2-4, 4A, 5, 5A, 6, 6A, and 7-11 are schematic diagrams illustrating a method comprising a series of processes and structures for fabricating a thin film photovoltaic cell according to certain embodiments of the present invention.

At Process 1010, a soda lime glass substrate is provided. This process can be visually illustrated by FIG. 2. FIG. 2 is a simplified diagram illustrating a soda lime glass substrate provided for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown, the soda lime glass substrate 100 including a surface region 101 is provided. The soda lime glass has been widely used as window glass. One important reason for choosing the soda lime glass as substrate for forming thin film photovoltaic cells other than simple economical concern is a positive influence of alkaline ions (e.g., $Na^+$) on the grain growth of high efficiency thin film photovoltaic materials. For example, polycrystalline compound semiconductor films of chalcopyrite structure $CuIn(Ga)Se_2$ or $CuInSe_2$ materials can be formed on soda lime glass substrates with coarse grain sizes of 1 microns or larger so that high cell current can be collected with these photovoltaic films to have light-conversion efficiencies of 17% or above. Without the doping of sodium atoms, the same film material formed on other type of substrate has much finer sized grains. In certain implementations, the surface region 101 is subjected to certain pre-treatment process so that the surface region 101 is cleaned substantially free from surface contaminations, greases, dirts, dusts and particles having sizes larger than 3 microns.

Figure 3:
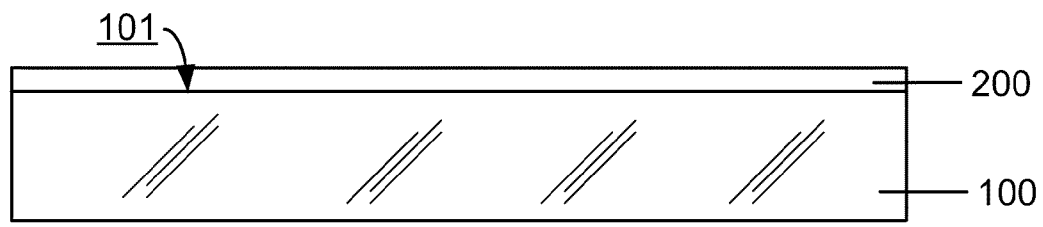

At Process 1020, a lower electrode layer is formed overlying the surface region of the soda lime glass substrate. This process can be visually illustrated by FIG. 3. As shown, the lower electrode layer 200 is formed overlying the surface region 101 of the soda lime glass substrate 100. The lower electrode layer 200 is to serve a back electrode for thin film photovoltaic cells to be formed in subsequent processes. Here "lower" is merely a word for current example of forming a thin film on substrate, the thin film is to become a bottom solar cell. "Lower" electrode may correspond to an "upper" or "front" electrode that is located on top of a window layer. While when the substrate is used as "superstrate" in an application of forming a top solar cell, the lower or upper electrodes can be disposed in opposite way. In certain cases when no confusion, only electrode layer is mentioned. In particular, either the lower or upper electrode layer can be optically transparent. For example, the lower electrode layer is made of molybdenum material with thickness ranging from 0.2 to 1 microns. In other examples, transparent conductive oxide can be used as the material for upper electrode layer. In certain implementations, the formation of the electrode layer can be achieved using a deposition process, such as sputtering, plating, evaporation, plasma deposition, and the like and any other suitable technique. Of course, there can be other variations, modifications, and alternatives.

Figure 4:
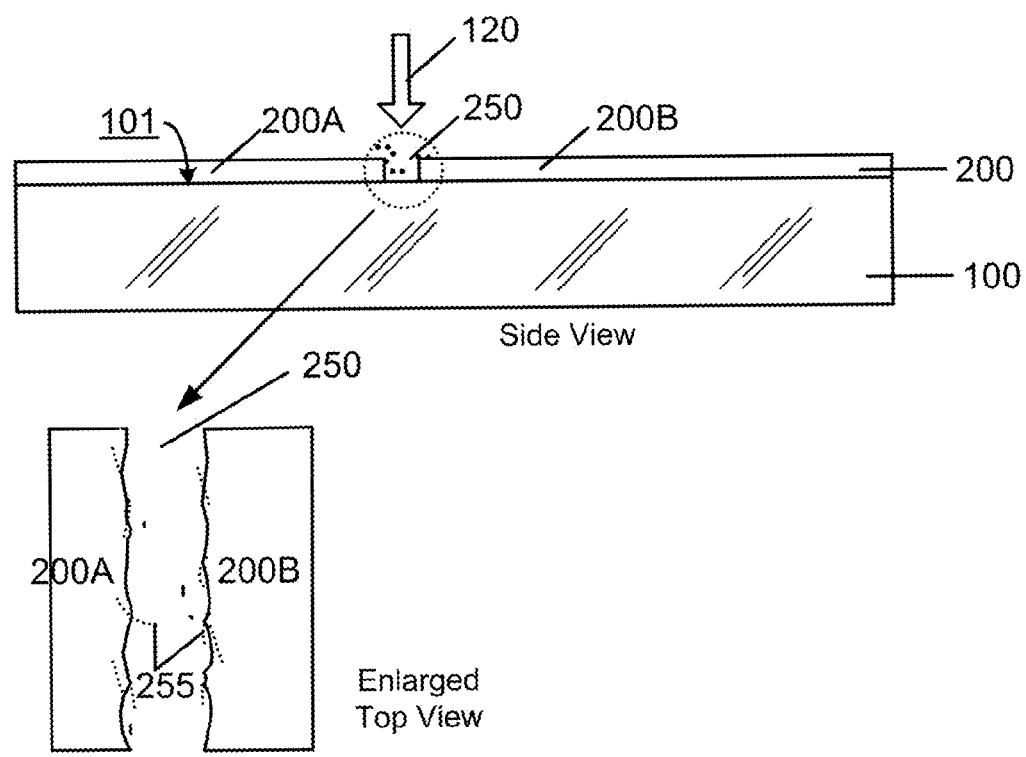

In the next process (1030), the method 1000 includes subjecting the lower electrode layer with a laser radiation to ablate one or more patterns. This laser patterning or ablation process can be visually illustrated by FIG. 4. FIG. 4 is a schematic diagram illustrating a process for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown, the lower electrode layer 200 is subjected to a laser radiation 120 at certain predetermined locations. The laser radiation 120 can be a beam of pulsed laser or CW laser. The laser beam can be aligned from above the lower electrode layer 200 or from a back surface region of the soda lime glass substrate 100 for the glass is optically transparent. This laser alignment option is depended on the design of a manufacture system and specific thin film growth processes. Typically the laser beam is generated from a Nd: YAG infrared Q-Switched pulse laser source with wavelength of about 1065 nm. Of course, other types of laser sources with different wavelength or pulse rate can also be used depending on applications.

In one embodiment, the laser beam 120 irradiating the lower electrode layer 200 causes an ablation process in which a portion of the lower electrode layer under the laser beam is removed from the soda lime glass substrate 100. In particular, the laser energy causes vaporization of electrode layer material, e.g., molybdenum, under a beam spot or simply blows away from the substrate 100. The laser beam 120 can be scanned along a predetermined pattern and subsequently additional amount of electrode layer material is removed. Each time after the laser beam ablates a spot of electrode layer material, the beam is moved (may be pulsed OFF) to a next spot, then the laser power is pulsed ON to irradiate the new spot again to cause the electrode layer material under the new spot to be removed. As a result, the electrode layer 200, which is initially deposited as a continues film overlying the surface region 101 of the soda lime glass substrate 100, is going through a laser patterning process to form one or more patterns (or laser ablated patterns).

As shown in the side view portion of the FIG. 4, one of the one or more patterns 250 is schematically illustrated, separating the electrode layer 200 into a left portion 200A and a right portion 200B. An enlarged top view shows more details of a circled portion of a particular pattern 250 that separates the lower electrode layer 200 to the two portions 200A and 200B. In particular, the enlarged view shows that the pattern 250 is actually a continuous line with a width of about 25 to 50 microns of the lower electrode layer with being substantially removed from the glass substrate by the laser ablation process. As a result, a street structure is formed within the electrode layer 200. In certain embodiments, multiple streets with an average separation of about 6 mm are formed in the electrode layer overlying the whole surface region of the soda lime glass substrate, defining a stripe-shaped cell between each neighboring streets.

Due to laser beam spatial profile and pulse/scan variation, one or more berm structures 255 are formed within the pattern 250. In a specific embodiment, the one or more berm structures 255 usually are located near edges of the pattern 250, while some may also be left near the middle region of the pattern 250. As shown, the one or more berm structures 255 have irregular shapes. Depending on the applications, the one or more berm structures 255 may include residue material of the electrode layer 250 or contaminants from a system housing the soda lime glass substrate. Because of the berm structures 255 are electrically conductive, they may causes electrical shorting of thin film devices if they are not substantially cleaned or freed by a suitable process.

Figure 4A:
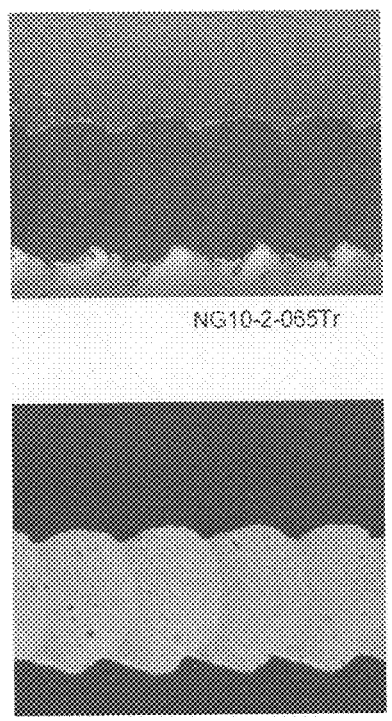

FIG. 4A is a microscope image showing a laser ablated pattern formed on a thin film over a glass substrate. As shown, the laser ablated pattern is created by irradiating a round laser spot on the thin film to remove the thin film material under the spot at least partially. Additionally, the laser spot is allowed to scan from one spot to next, thereby removing thin film material along the way. Provided a certain scanning speed of the laser beam, a street or a channeled pattern is formed. As a top view in FIG. 4A, the street 255 corresponds to the laser ablated pattern 250 in the lower electrode layer 200 seen as a side view in FIG. 4. However, imperfection during the laser ablation process may leave certain amount of residue/redeposit or un-removed portion of the thin film material forming one or more berm structures 255 inside or around the laser ablation pattern 250. These berm structures 255 may cause thin film device degradation, shorting or other problems. Embodiments of the present invention provide a method to substantially clean the laser ablation pattern free from these berm structures. More detail descriptions on the method can be found throughout this specification and more specifically below.

Figure 5:
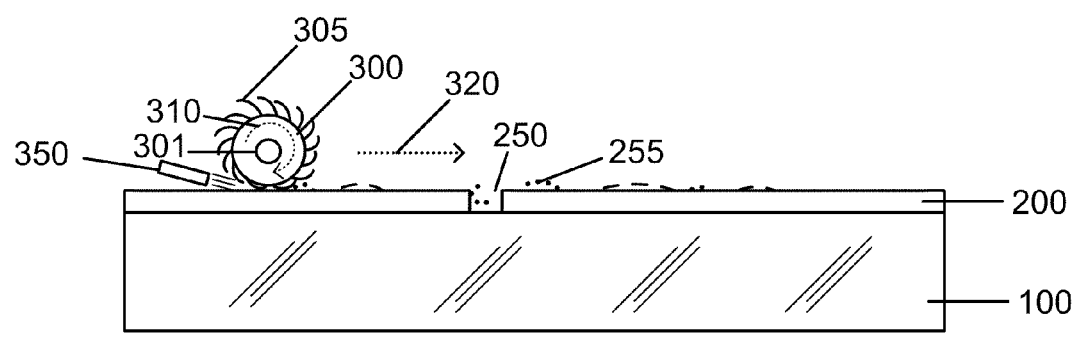

In the next process 1040, the method 1000 includes processing the lower electrode layer having one or more patterns to remove the one or more berm structures therein. This process can be visually illustrated by FIG. 5. FIG. 5 is a schematic diagram illustrating a process for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown in FIG. 5 a specific embodiment of the method 1000 provides a mechanical brush device 300 disposed above the lower electrode layer 200. The mechanical brush device 300 includes a rotor 301 carrying an outer edge comprising a plurality of bristles 305. In one embodiment, the rotor 301 is powered to rotate along clockwise direction 310 and at the same time is configured to laterally move along a direction 320 which is substantially in parallel to the surface of the soda lime glass substrate. In a specific embodiment, the brush moving direction 320 can be either parallel or perpendicular to the laser ablation pattern 250 for the purpose of effectively removing the debris or particles inside the pattern. Also shown, a sprayer 350 is associated with the operation of the mechanical brush device 300 to provide a liquid, de-ionized water in a preferred embodiment, during the brushing process.

In certain implementation of the process 1040, the mechanical brush device 300 can be disposed to a proper height above the lower electrode layer 200 and rolling the plurality of bristles 305 with a predetermined rotation speed (along a direction 310) while at the same time moving laterally with a predetermined lateral speed (along a direction 320). Subsequently, the mechanical brush device 300 is configured to adjust its height and lateral moving direction so that the one or more berm structures 255 within or around the one or more patterns 250 in various orientations and densities can be removed properly and as completely as possible. Of course, there can be other variations, alternatives and modifications in the control of rotation/lateral direction/speed, and configurations of the mechanical brush device including relative position of the rotor, a length of each bristle, supply of liquid from the sprayer 350, and so on. For example, the length of the brush bristles can be chosen to be sufficient to reach the depth of the laser scribed trench so that it can substantially clean up the debris (caused by laser ablation) inside the scribed region in addition to removing the berm structures on the surface region.

In a specific embodiment, the plurality of bristles 305 are made of a nylon material. The mechanical strength of the nylon-based bristles provides necessary forces to remove the one or more berm structures which are scattered around and bonded to the substrate with relative small forces. While the nylon-based bristles also have relative flexibility by their nature, depending further on how to group a certain number of bristles together and how distribute them around the outer edge of the mechanical brush device 300, so that the forces generated by these bristles would not cause injures to the remaining portions of lower electrode layer (e.g., 200A and 200B), which bonded to are attached to the substrate with much stronger forces. The mechanical brush device 300 including nylon-based bristles 305 according to an embodiment of the invention is able to consistently remove the one or more berm structures 255 from the one or more patterns 250 of the lower electrode layer made of molybdenum material.

Figure 5A:
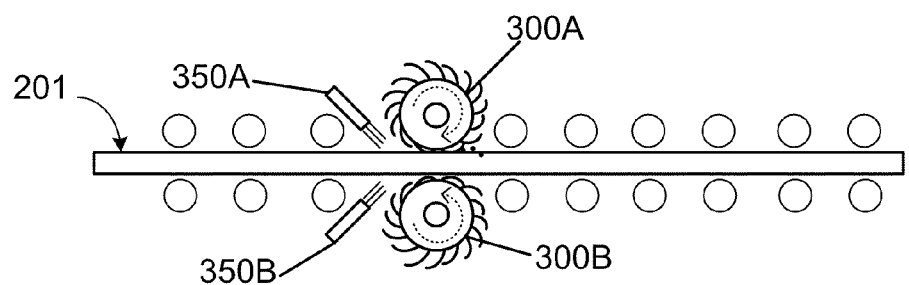

In an alternative embodiment, the mechanical brush device can be applied from both sides of the transparent substrate. As schematically shown in FIG. 5A, which is a side view illustrating a substrate being transferred along a plurality of rollers within a batch system. In this figure, one mechanical brush device 300A including a water sprayer 350A is applied from a top surface region 201 and another mechanical brush device 300B, both of which can be substantially the same as the mechanical brush device 300, is applied from bottom surface region of the substrate. In one example, the top surface region 201 is a surface of the lower electrode layer 200 overlying the substrate 100. In another example, the top surface region 201 includes one or more portions being part of the one or more patterns 250 formed within the lower electrode layer 200.

Referring to FIG. 1, the method 1000 further includes a process 1050 of treating the lower electrode layer with the one or more patterns free of the one or more berm structures. This process can be visually illustrated by FIG. 6, which is a schematic diagram showing a process for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown in a specific embodiment, part of the treatment process 1050 involves a clean process during which the soda lime glass substrate 100 coated with an electrode layer 200 is exposed to a cleaning liquid 400. In one implementation, the cleaning liquid 400 comprises at least DI-water that physically wash out and reactively desorb surface residues. Subsequently, another part of the treatment process 1050 involves a process of applying an air knife blower to remove moisture and any dusts left on a surface region of the electrode layer 200.

Figure 6:
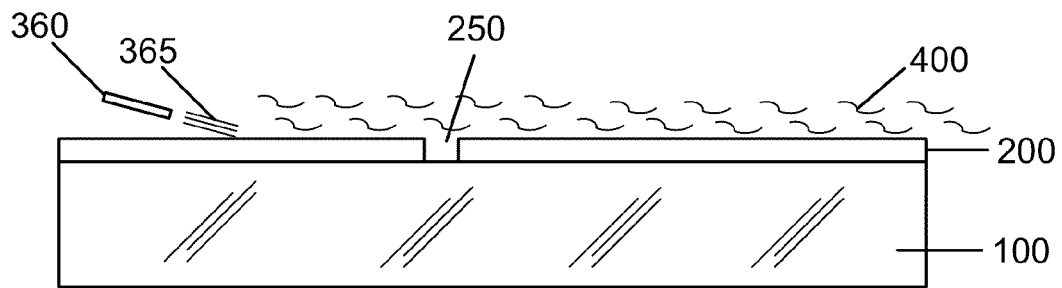

In one implementation, as schematically shown in FIG. 6, a gas knife blower 360 is disposed near the surface region of the electrode layer 200 including one or more patterns 250 after the cleaning process using the cleaning solution 400. In one example, the gas knife 360 is an air knife with an elongated nozzle capable of providing a faceted profile of high speed air flow 365. The impact air flow 365 with the faceted profile is very effective for drying and cleaning the surface region including one or more (stripe shaped) patterns. In another example, dry nitrogen can be the gas in the gas knife. In one embodiment, the air knife blower 360 is capable of adjusting an angle relative to the surface region 201 for achieving a desirable drying/cleaning effect. For example, the angle between the faceted profile of the air relative to the surface can be adjusted from 90 degrees to somewhat 45 degrees or 30 degrees and lower to enhance the drying effect. In another example, an angle between the air flow direction and the laser scribing pattern can also be adjusted between 0 to 90 degrees to enhance the debris cleaning effect. In an alternative embodiment, air pressure control of the air knife blower 360 can be used during the debris removal process, especially for removing debris inside the laser scribed pattern region. In a specific embodiment, using the air knife blower 360 for drying the surface region can substantially remove any liquid including the residues of the cleaning liquid 400, water droplets, or other chemicals in liquid forms. In another specific embodiment, using the air knife blower 360 to remove the liquid introduced in the treating process can be accomplished by direct blowing away physically and substantially free from causing any evaporation. Thus, the drying effect according to the above implementation of embodiments of the invention results in substantially free of any moisture residue on the lower electrode layer including one or more patterns.

Figure 6A:
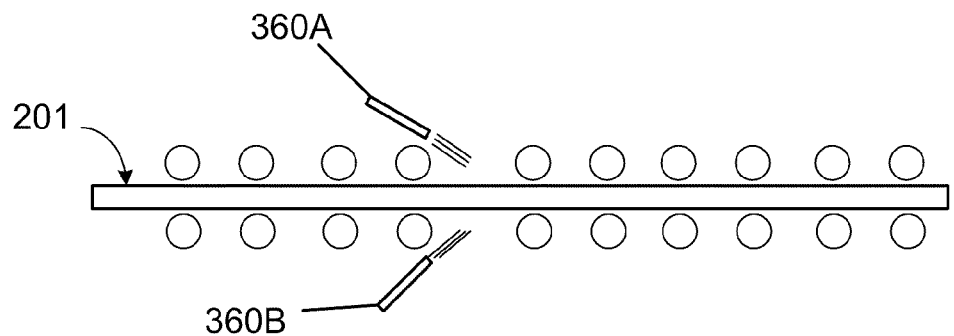

In another implementation, as schematically shown in FIG. 6A, both sides of the substrate can be applied with the air knife blowers in the above drying/cleaning process. As shown, a substrate being transferred along a plurality of rollers within a batch system. The substrate has a top surface region 201 which is essentially a surface of the lower electrode layer 200 overlying the soda lime glass substrate 100 in FIG. 5. One air knife blower 360A is applied from above the top surface region 201 and another air knife blower 360B is applied from the bottom of the substrate. Essentially, the treating process 1050 is a combined process including exposing the substrate to a cleaning liquid 400 and using an air knife blower 360 to dry the substrate including the lower electrode layer 200 with one or more patterns 250. The treatment process results in the lower electrode layer 200 with one or more patterns 250 substantially free from any one or more berm structures 255 and any moisture residues.

Figure 7:
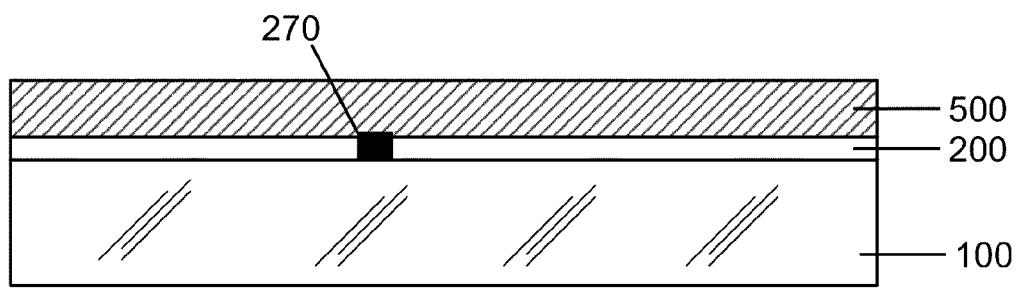

Referring to FIG. 1 again, the method 1000 includes a process (1060) of forming a layer of photovoltaic material overlying the electrode layer. This process can be visually illustrated by FIG. 7, which is a schematic diagram showing a process for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown, a layer of photovoltaic material 500 is formed overlying the lower electrode layer 200. In particular, before or during the process 1060 of the formation of the layer of photovoltaic material 500, a pattern 250 formed by laser ablation (process 1030) in the lower electrode layer 200 can be filled with a conductive material to form an interconnect structure 270. The interconnect structure can serve as an electrical lead for collecting current from a thin film solar cell to be formed with the layer of photovoltaic material. In a specific embodiment, the layer of photovoltaic material 500 is made of copper indium diselenide (CIS) material using a sputtering and a thermal annealing based selenization process. In another specific embodiment, the layer of photovoltaic material 500 comprises a copper indium gallium diselenide (CIGS) material, or copper indium disulfide material using one or more suitable thin film deposition processes. In one typical implementation, the layer of photovoltaic material 500 is a p-type semiconductor material acting as an light absorber of a thin film photovoltaic device. In one embodiment, with a certain amount of sodium content doped therein, the layer of CIGS material formed on (the lower electrode layer over) the soda lime glass substrate can have large grain sizes larger than 1 microns. Therefore, high cell current can be expected for achieving 17% or greater efficiency for the resulted thin film solar cell.

Although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein.

Figure 8:
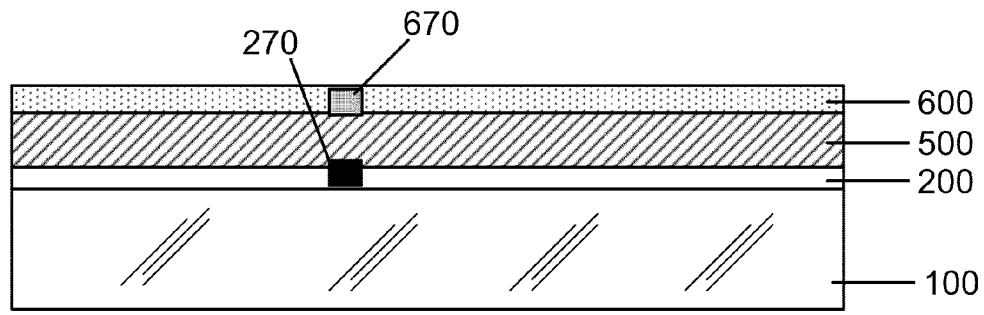

Furthermore, the method 1000 includes a process (1070) of forming an upper electrode layer over the layer of photovoltaic material. Here the upper electrode layer or the second electrode layer is a first zinc oxide layer which is a kind of transparent conductive oxide or TCO. As shown in FIG. 8, subsequent to process 1060, the process 1070 leads to a formation of the second electrode layer 600 overlying the layer of photovoltaic material 500. FIG. 8 is merely an example, which should not unduly limit the scope of the claims herein. One of ordinary skill in the art would recognize many variations, alternatives, and modifications. In a specific embodiment, the second electrode layer 600 is a first zinc oxide layer. In one example, the first zinc oxide layer is formed using a metalorganic chemical vapor deposition (MOCVD) technique within a batch system. The formed first zinc oxide layer by MOCVD is a rough layer, which can diffuse the incoming light by scattering, increasing the efficiency of solar cells. Additionally, the first zinc oxide layer 600 can be mechanically patterned to form one or more patterns which in additions are used to form at least another interconnect structure 670 for the thin film photovoltaic cell, shown as an example in FIG. 8.

The method 1000 then can include a process 1070 for any additional step of fabricating a thin film photovoltaic device. For example, the process 1070 can be another mechanical patterning for configuring the second or upper electrode layer, can be a mechanical isocut process for preparing one or more unit cells, and can be a mechanical bus pad cleaning process for assembling the one or more unit cells. Of course, there can be many variations, alternatives, and modifications.

Figure 9:
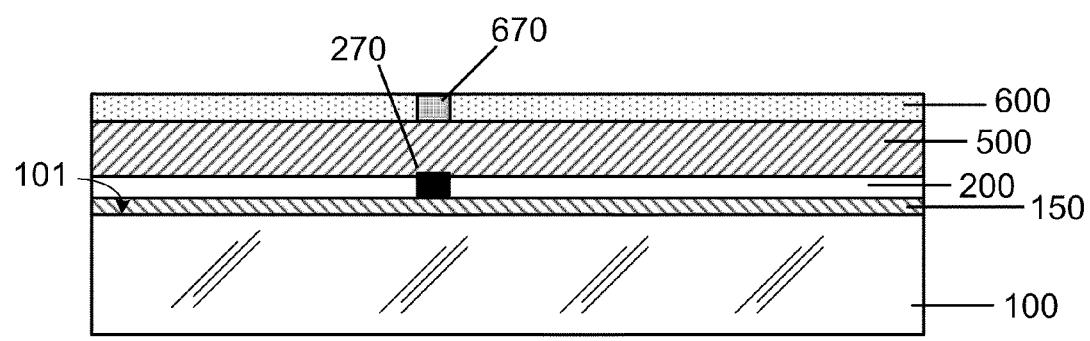

In an alternative embodiment, the method 1000 may include a process of forming a barrier layer directly onto the surface region (after a pre-washing treatment process) of the soda lime glass substrate before the process 1020 for forming a lower electrode layer. FIG. 9 shows a process of fabricating a thin film photovoltaic cell on soda lime glass substrate according to an alternative embodiment of the present invention. This diagram is merely an example, which should not unduly limit the scope of the claims herein. One of ordinary skill in the art would recognize many variations, alternatives, and modifications. As shown, a barrier layer 150 is inserted between the lower electrode layer 200 and the surface region 101 of the soda lime glass substrate 100. Because excessive, uncontrolled amount of sodium may reduce the grain sizes of the photovoltaic thin film grown on the soda lime glass substrate, the barrier layer 150 is applied for preventing sodium element from diffusing into the upper layers especially the layer of photovoltaic material. In one embodiment, the barrier layer 150 is a layer of silicon dioxide formed by a sputtering process, which serves as an effective sodium diffusion barrier with a thickness of only about 200 Angstroms or greater. Other materials including aluminum oxide, silicon nitride, titanium nitride, titanium oxide, or zirconium oxide also can be used depending on applications. In an alternative embodiment, the barrier layer property can be engineered or adjusted to improve the effectiveness of blocking sodium ion diffusion from glass into photovoltaic active layers. For example, the barrier layer density can be a factor utilized. Higher barrier layer density can be used to raise the diffusion barrier and limit the amount of sodium diffusion.

Figure 10:
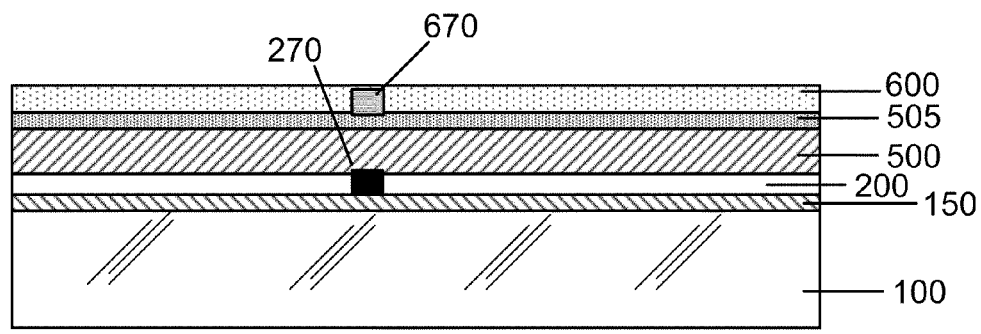

In another alternative embodiment, the method 1000 can include a process of forming a cadmium sulfide layer overlying the layer of photovoltaic material before forming the first zinc oxide layer. In particular, as shown in FIG. 10 the layer of photovoltaic material 500 is a layer of copper indium diselenide material overlying the lower electrode molybdenum layer 200. The cadmium sulfide layer 505, characterized as a wide bandgap semiconductor, is formed over the layer of copper indium diselenide material 500 to serve as a window layer for the thin film photovoltaic cell while the layer of copper indium diselenide material 500 acting as an absorber layer. In certain embodiments, the cadmium sulfide layer 505 is considered as one part of the layer of photovoltaic material which is formed using a multilayer deposition and treatment process. In one example, the cadmium sulfide layer 505 can be formed using sputtering, vacuum evaporation, or chemical bath deposition (CBD) techniques and doped with $n^+$-type impurities for conductivity. Depending on embodiments, the window layer can be selected from a group materials consisting of a cadmium sulfide (CdS), a zinc sulfide (ZnS), zinc selenium (ZnSe), zinc oxide (ZnO), zinc magnesium oxide (ZnMgO), or others.

Figure 11:
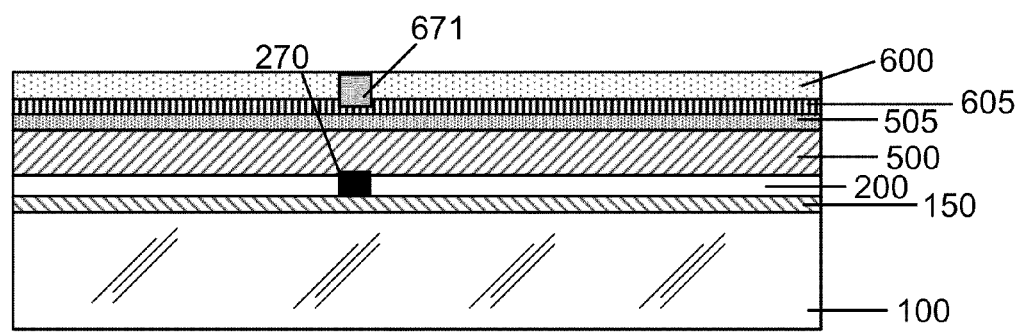

In yet another alternative embodiment, the method 1000 can include a process of forming a second zinc oxide layer before forming the first zinc oxide layer. As shown in FIG. 11 the second zinc oxide layer 605 is first formed over the layer of photovoltaic material, or in particular over the cadmium sulfide layer 505, and the first zinc oxide layer 600 is formed over the second oxide layer 605. The layer of photovoltaic material 500 is a layer of copper indium diselenide material overlying the lower electrode molybdenum layer 200. In a specific embodiment, the second zinc oxide layer 605 has a higher resistivity than the first zinc oxide layer 600. Functionally, the second zinc oxide layer 605 plays more a role of barrier/protection layer while the first zinc oxide layer 600 with lower resisitivity plays more a role of conductive electrode layer. In certain embodiment, the second zinc oxide layer 605 is also formed using a metalorganic chemical vapor deposition (MOCVD) technique within a batch system.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a thin film photovoltaic device having patterned electrode films, the method comprising:
    providing a soda lime glass substrate comprising a surface region;
    forming a lower electrode layer comprising a molybdenum material overlying the surface region;
    subjecting the lower electrode layer with one or more pulses of electromagnetic radiation from a laser source, the one or more pulses of electromagnetic radiation being capable of ablating one or more patterns from the lower electrode layer, the one or more patterns comprising one or more berm structures;
    processing the lower electrode layer comprising the one or more patterns using a mechanical brush device to remove the one or more berm structures;
    treating the lower electrode layer comprising the one or more patterns free from the one or more berm structures;
    forming an interconnect structure by filling a pattern, from the one or more patterns, with a conductive material, wherein a height of the interconnect structure is substantially equal to a thickness of the lower electrode layer;
    forming a layer of photovoltaic material overlying the lower electrode layer and the interconnect structure; and
    forming a first zinc oxide layer overlying the layer of photovoltaic material.

2. The method of claim 1 further comprising treating the surface region with one or more cleaning process to remove one or more particulates and/or contaminates.

3. The method of claim 1 further comprising forming a barrier layer overlying the surface region, the barrier layer being characterized to maintain the one or more sodium species within the soda lime glass substrate.

4. The method of claim 3 wherein the barrier layer comprises a silicon dioxide material having a thickness of about 200 Angstroms and greater.

5. The method of claim 3 wherein the barrier layer comprises a material selected from aluminum oxide, silicon nitride, titanium nitride, titanium oxide, and zirconium oxide.

6. The method of claim 1 further comprising forming a second zinc oxide layer overlying the layer of photovoltaic material before forming the first zinc oxide layer, the first zinc oxide layer having a lower resistivity than the second zinc oxide layer.

7. The method of claim 6 wherein the layer of photovoltaic material comprises a copper indium diselenide material.

8. The method of claim 7 further comprising a cadmium sulfide layer overlying the copper indium diselenide layer before forming the first zinc oxide layer.

9. The method of claim 1 wherein the laser source is a Q-switched infrared pulsed YAG laser.

10. The method of claim 1 wherein the mechanical brush device comprises a plurality of bristles comprising nylon material.

11. The method of claim 1 wherein the treating the lower electrode layer comprising the one or more patterns comprises subjecting the lower electrode layer comprising the one or more patterns to a cleaning liquid.

12. The method of claim 11 further comprising using one or more gas knifes, after treating the lower electrode layer comprising the one or more patterns, to remove the cleaning liquid from the lower electrode layer such that the cleaning liquid is substantially free any evaporation.

13. A method for forming a thin film photovoltaic device having patterned electrode films, the method comprising:
    providing a soda lime glass substrate comprising a surface region;
    forming a lower electrode layer comprising a molybdenum material overlying the surface region;
    subjecting the lower electrode layer with one or more pulses of electromagnetic radiation from a laser source, the one or more pulses of electromagnetic radiation being capable of ablating one or more patterns from the lower electrode layer, the one or more patterns comprising one or more berm structures;
    processing the lower electrode layer comprising the one or more patterns using a mechanical brush device and a cleaning liquid to remove the one or more berm structures;
    processing the lower electrode layer comprising the one or more patterns free from the one or more berm structures using a gas knife, the gas knife being configured to remove substantially any liquid including liquid droplets from a surface of the lower electrode layer to dry the lower electrode layer comprising the one or more patterns free from the one or more berm structures;
    treating the surface region with one or more cleaning process to remove one or more particulates and/or contaminates;
    forming a barrier layer overlying the surface region, the barrier layer being characterized to maintain the one or more sodium species within the soda lime glass substrate;
    forming an interconnect structure by filling a pattern, from the one or more patterns, with a conductive material, wherein a height of the interconnect structure is substantially equal to a thickness of the lower electrode layer;
    forming a layer of photovoltaic material overlying the lower electrode layer and the interconnect structure; and
    forming an upper electrode layer overlying the layer of photovoltaic material.

14. The method of claim 13 wherein using the gas knife comprises configuring an air knife with an elongated nozzle to provide a facet profile of dry air with adjustable angles relative to the surface region.

15. The method of claim 1 wherein the one or more patterns is a continuous line characterized by a width of between 25 μm and 50 μm.

16. The method of claim 1 wherein a plurality of patterns are formed and separated from each other by a distance of about 6 mm.

17. The method of claim 1 wherein processing the lower electrode layer comprises rotating the mechanical brush device along a clockwise direction and concurrently moving the mechanical brush device in a lateral direction substantially parallel to soda lime glass substrate.

18. The method of claim 17 wherein processing the lower electrode layer comprises moving the mechanical brush device in a direction perpendicular to the one or more patterns.

19. The method of claim 14 wherein the adjustable angles are in a range from about 30 degrees to 90 degrees.

20. A method comprising:
    providing a soda lime glass substrate comprising a surface region;
    forming a first electrode layer having a predetermined thickness and overlying the surface region;
    forming one or more patterns in the first electrode layer using one or more pluses of electromagnetic radiation from a laser source, the one or more patterns comprising one or more berm structures;

processing the first electrode layer using a mechanical brush device to remove the one or more berm structures from the one or more patterns, the mechanical brush device being moved laterally along the surface region of the soda lime glass substrate and in a direction perpendicular to the one or more patterns;

cleaning a surface region of the first electrode layer and the surface region of the soda lime glass substrate using a cleaning liquid to physically wash out and reactively desorb surface residues;

cleaning the surface region of the first electrode layer and the surface region of the soda lime glass substrate using a gas knife, the gas knife being disposed such that an angle between a faceted profile of air provided by the gas knife and the surface region of the first electrode layer is in the range of between 30 degrees and 90 degrees;

filling a first pattern from the one or more patterns with a conductive material to form a first interconnect structure, the first interconnect structure being characterized by a height substantially equal to the thickness of the first electrode layer;

forming a layer of photovoltaic material overlying the first electrode layer and the first interconnect structure;

forming a second electrode layer overlying the layer of photovoltaic material; and processing the second electrode layer to from a second interconnect structure, the second interconnect structure being characterized by a height substantially equal to a thickness of the second electrode layer.

* * * * *